United States Patent
Chen et al.

(10) Patent No.: US 8,557,669 B2
(45) Date of Patent: Oct. 15, 2013

(54) MOSFET DEVICE WITH LOCALIZED STRESSOR

(75) Inventors: Chien-Hao Chen, Chuangwei Township (TW); Pang-Yen Tsai, Hsin-Chu Hsian (TW); Chie-Chien Chang, Miow-Li County (TW); Tze-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 546 days.

(21) Appl. No.: 12/176,655

(22) Filed: Jul. 21, 2008

(65) Prior Publication Data

US 2010/0015814 A1    Jan. 21, 2010

(51) Int. Cl.
*H01L 21/42* (2006.01)

(52) U.S. Cl.
USPC ............ 438/300; 438/795; 257/E21.328

(58) Field of Classification Search
USPC ............ 438/197, 300, 533, 682, 683, 795
See application file for complete search history.

(56) References Cited

U.S. PATENT DOCUMENTS

| | | | |
|---|---|---|---|
| 6,214,679 B1 | 4/2001 | Murthy et al. | |
| 6,406,973 B1 | 6/2002 | Lee | |
| 6,703,271 B2 | 3/2004 | Yeo et al. | |
| 6,759,697 B2 | 7/2004 | Toyoda et al. | |
| 6,946,371 B2 | 9/2005 | Langdo et al. | |
| 6,960,781 B2 | 11/2005 | Currie et al. | |
| 7,060,576 B2 | 6/2006 | Lindert et al. | |
| 2004/0005740 A1* | 1/2004 | Lochtefeld et al. | 438/149 |
| 2004/0026765 A1 | 2/2004 | Currie et al. | |
| 2004/0115878 A1 | 6/2004 | Lee et al. | |
| 2004/0157399 A1 | 8/2004 | Lee et al. | |
| 2005/0285192 A1 | 12/2005 | Zhu | |
| 2006/0011984 A1* | 1/2006 | Currie | 257/352 |
| 2006/0081875 A1 | 4/2006 | Lin et al. | |
| 2006/0163672 A1 | 7/2006 | Wang et al. | |
| 2006/0189053 A1 | 8/2006 | Wang et al. | |

OTHER PUBLICATIONS

Bedell, S.W., et al., "300 mm SGOI/Strained-Si for High-Performance CMOS," 2004 Semiconductor Equipment and Materials International, Semicon West (2004) 6 pages.

(Continued)

*Primary Examiner* — Alexander Ghyka
(74) *Attorney, Agent, or Firm* — Slater & Matsil, L.L.P.

(57) ABSTRACT

MOSFETs having localized stressors are provided. The MOSFET has a stress-inducing layer formed in the source/drain regions, wherein the stress-inducing layer comprises a first semiconductor material and a second semiconductor material. A treatment is performed on the stress-inducing layer such that a reaction is caused with the first semiconductor material and the second semiconductor material is forced lower into the stress-inducing layer. The stress-inducing layer may be either a recessed region or non-recessed region. A first method involves forming a stress-inducing layer, such as SiGe, in the source/drain regions and performing a nitridation or oxidation process. A nitride or oxide film is formed in the top portion of the stress-inducing layer, forcing the Ge lower into the stress-inducing layer. Another method embodiment involves forming a reaction layer over the stress-inducing layer and performing a treatment process to cause the reaction layer to react with the stress-inducing layer.

20 Claims, 5 Drawing Sheets

(56) References Cited

OTHER PUBLICATIONS

Chidambaram, P.R., et al., "35% Drive Current Improvement from Recessed-SiGe Drain Extensions on 37 nm Gate Length PMOS," Symposium on VLSI Technology Digest of Technical Papers (2004) pp. 48-49.

Ghani, T., et al., "A 90nm High Volume Manufacturing Logic Technology Featuring Novel 45nm Gate Length Strained Silicon CMOS Transistors," IEDM (2003) pp. 978-980.

Lee, B.H., et al., "Performance Enhancement on Sub-70nm Strained Silicon SOI MOSFETs on Ultra-thin Thermally Mixed Strained Silicon/SiGe on Insulator (TM-SGOI) Substrate with Raised S/D," IEDM (2002) pp. 946-948.

Mizuno, T., et al., "High-Performance Strained-SOI CMOS Devices Using Thin Film SiGe-on-Insulator Technology," IEEE Transactions on Electron Devices, vol. 50, No. 4 (Apr. 2003) pp. 988-994.

Tezuka, T., et al., "A Novel Fabrication Technique of Ultrathin and Relaxed SiGe Buffer Layers with High Ge Fraction for Sub-100 nm Strained Silicon-on-Insulator MOSFETs," Jpn. J. Appl. Phys., vol. 40 (Apr. 2001) pp. 2866-2874.

* cited by examiner

MOSFET DEVICE WITH LOCALIZED STRESSOR

This application is a divisional of patent application Ser. No. 11/034,282, entitled "MOSFET Device with Localized Stressor," filed on Jan. 12, 2005, which application is incorporated herein by reference.

TECHNICAL FIELD

The present invention relates generally to semiconductor devices, and more particularly, to metal-oxide-semiconductor field-effect transistors and methods of manufacture.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, semiconductor alloy layers, such as silicon-germanium or silicon-germanium-carbon, are formed below an overlying thin semiconductor layer, wherein the semiconductor alloy layer has a different lattice structure than the overlying semiconductor layer. The difference in the lattice structure imparts strain in the overlying semiconductor layer to increase carrier mobility.

This approach, however, can be difficult to process in addition to presenting junction leakage concerns as a result of the blanket semiconductor alloy layer. The level of germanium in the epitaxially grown semiconductor alloy layer can be difficult to control. In addition, the presence of a blanket semiconductor alloy layer allows an unwanted interface between the source/drain regions to exist, possibly introducing junction leakage.

In another approach, strain in the channel is introduced by creating a recess in the substrate in the source/drain regions. A layer of SiGe is epitaxially grown within the recessed regions, thereby introducing strain in the channel. The amount of stress may be increased by increasing the Ge concentration during the growth process. To increase the Ge concentration in the recessed area, however, creates process challenges. For example, increasing the Ge concentration during the epitaxial growth results in a higher density of dislocations and defects in the SiGe layer. Degraded selectivity and deposition process windows are also of concern.

Therefore, there is a need for an efficient and cost-effective method to induce strain in the channel region such that the performance characteristics of transistors are enhanced.

SUMMARY OF THE INVENTION

These and other problems are generally reduced, solved or circumvented, and technical advantages are generally achieved, by embodiments of the present invention, which provides a strained semiconductor device to improve the operating characteristics of the semiconductor device and a method of manufacture.

In an embodiment of the present invention, a metal-oxide-semiconductor field-effect transistor (MOSFET) having localized stressors formed in the source/drain regions is provided. The localized stressors comprise a stress-inducing layer formed in recesses in the source/drain regions. The stress-inducing layer comprises a first semiconductor material and a second semiconductor material. A process is performed on the stress-inducing layer such that the concentration of the second semiconductor material is increased.

In another embodiment of the present invention, the stress-inducing layer is formed over a non-recessed region of the source/drain regions.

In another embodiment of the present invention, a first method of forming a MOSFET having localized stressors formed in the source/drain regions is provided. The first method comprises forming a stress-inducing layer in the source/drain regions (either recessed or non-recessed), wherein the stress-inducing layer comprises a first semiconductor material and a second semiconductor material. A treatment may then be performed. The treatment may be any process, such as an oxidation or a nitridation process, that causes an ambient to react with the first semiconductor material and forces the second semiconductor material further down into the stress-inducing layer.

In yet another embodiment of the present invention, a second method of forming a MOSFET having localized stressors formed in the source/drain regions is provided. The second method comprises forming a stress-inducing layer in the source/drain regions (either recessed or non-recessed), wherein the stress-inducing layer comprises a first semiconductor material and a second semiconductor material. A reaction layer is formed over the stress-inducing layer and a treatment is performed to cause the reaction layer to react with the first semiconductor material. As a result, the second semiconductor material is forced further into the stress-inducing layer.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
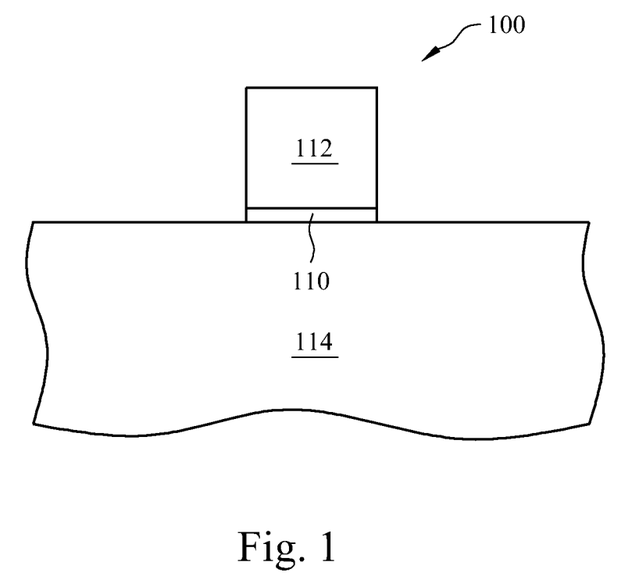
FIGS. 1-6 illustrate various process steps of fabricating a MOSFET device having localized stressors positioned over the source/drain regions in accordance with a first method embodiment of the present invention.

FIGS. 1-6 illustrate a method embodiment for fabricating a semiconductor device having a strained channel region in accordance with an embodiment of the present invention. Embodiments of the present invention illustrated herein may be used in a variety of circuits. Referring first to FIG. 1, a wafer 100 having a gate insulator layer 110 and a gate electrode 112 formed on a substrate 114 is shown in accordance with an embodiment of the present invention. The substrate 114 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The gate insulator layer 110 and the gate electrode 112 may be formed and patterned as is known in the art on the substrate 114. The gate insulator layer 110 is preferably a high-K dielectric material, such as silicon oxide, silicon oxynitride, silicon nitride, an oxide, a nitrogen-containing oxide, a combination thereof, or the like. Preferably, the gate insulator layer 110 has a relative permittivity value greater than about 4. Other examples of such materials include aluminum oxide, lanthanum oxide, hafnium oxide, zirconium oxide, hafnium oxynitride, or combinations thereof.

In the preferred embodiment in which the gate insulator layer 110 comprises an oxide layer, the gate insulator layer 110 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, the gate insulator layer 110 is about 8 Å to about 50 Å in thickness, but more preferably about 16 Å in thickness.

The gate electrode 112 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 112 may be formed by depositing doped or undoped poly-silicon by low-pressure chemical vapor deposition (LPCVD) to a thickness in the range of about 400 Å to about 2500 Å, but more preferably about 1500 Å.

The gate insulator layer 110 and the gate electrode 112 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate insulator layer 110 and the gate electrode 112 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Figure 2:
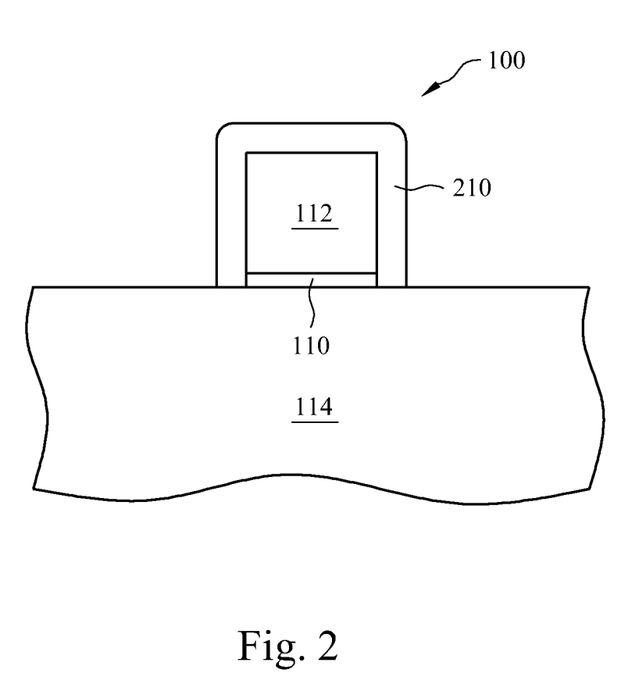

FIG. 2 illustrates wafer 100 after a mask 210 has been formed over the gate insulator layer 110 and gate electrode 112 in accordance with an embodiment of the present invention. The mask 210 acts as a mask to prevent epitaxial growth of SiGe along the surface of the gate insulator layer 110 and gate electrode 112 during subsequent processing steps. Generally, epitaxial growth of SiGe involves exposing silicon to germanium under specific process conditions. The germanium reacts with exposed silicon to grow SiGe. Because the gate insulator layer 110 and the gate electrode 112 are frequently formed of silicon, e.g., silicon dioxide and polysilicon, respectively, it may be desired to form a mask over the gate insulator layer 110 and the gate electrode 112 to prevent SiGe growth thereon.

The mask 210 may be formed by performing a blanket deposition of silicon nitride via a chemical vapor deposition (CVD) process, a physical vapor deposition (PVD) process, an atomic layer deposition (ALD) process, or the like. Once deposited, the mask 210 may be patterned via photolithography techniques. Preferably, the mask 210 is about 0 Å to about 1000 Å in thickness. It should be noted that the stressor (formed in subsequent steps) may be formed substantially adjacent to, spaced away from, or underneath the gate electrode.

Figure 3:
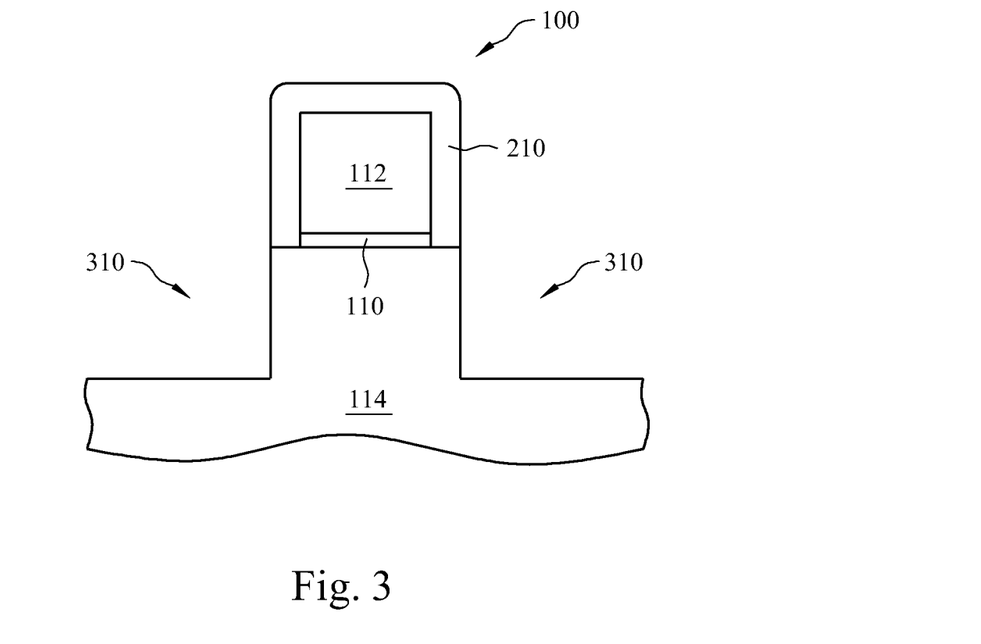

Referring now to FIG. 3, the wafer 100 is shown after an etching process has been performed to create recessed regions 310 in the substrate 114 on either side of the gate electrode 112 in accordance with an embodiment of the present invention. It should be noted that the portion of the substrate 114 located between the recessed regions 310 and below the gate insulator layer 110 and the gate electrode 112 defines the channel region.

It should also be noted that the processes described in FIGS. 1-6 illustrate source/drain regions having SiGe epitaxially grown in recessed regions 310 as an example of a preferred embodiment of the present invention. The processes described in FIGS. 1-6 may be applied to elevated-type SiGe regions in the source/drain regions. In this alternative embodiment, SiGe is epitaxially grown on the surface of the substrate 114 without forming recesses in the substrate 114. Thereafter, the same processes described herein may be performed to push the Ge lower, thereby creating an area of higher Ge concentration.

Referring back to FIG. 3, the recessed regions 310 may be formed by a plasma etch using chlorine and bromine chemistry. Preferably, the recessed regions have a depth from about 10 nm to about 200 nm. An optional anneal may be performed to facilitate silicon migration to repair any etch damage as well as to slightly smoothen the silicon surface for the subsequent epitaxy process.

Figure 4:
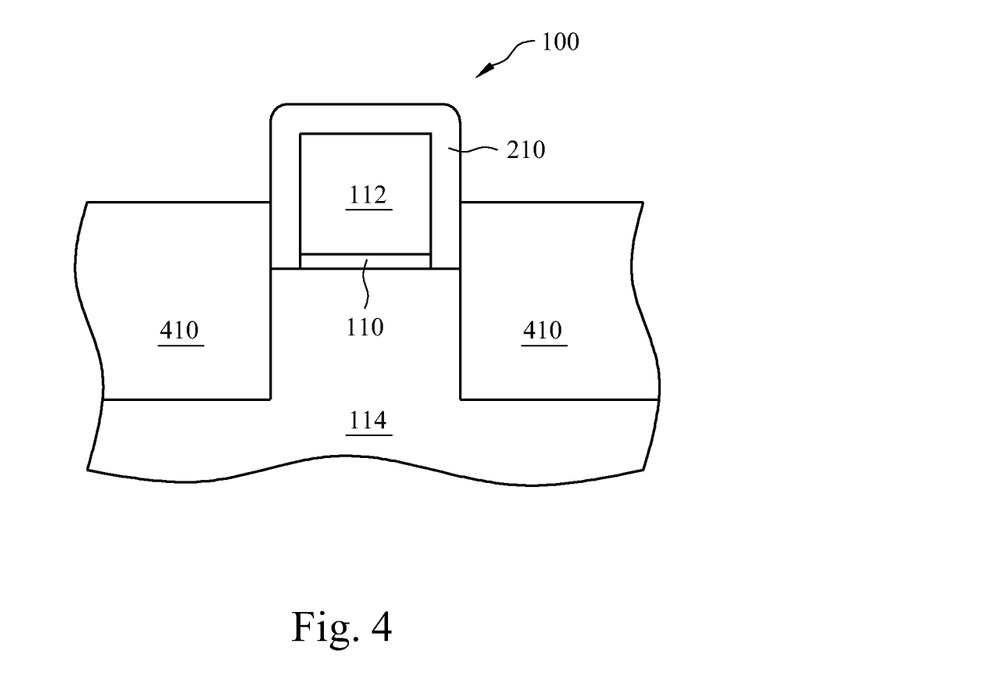

FIG. 4 illustrates the wafer 100 after an epitaxial growth of a stress-inducing layer 410, such as silicon germanium, in the recessed regions 310 in accordance with an embodiment of the present invention. The epitaxy process used to perform the epitaxial growth may be chemical vapor deposition, ultra-high vacuum chemical vapor deposition (UHV-CVD), or molecular beam epitaxy. The epitaxially grown materials may also extend above or below the surface of the substrate 114. A raised source/drain region is shown for illustrative purposes only. In a preferred embodiment, the stress-inducing layer 410 extends from about 0 nm to about 200 nm above the surface of the substrate 114. The stress-inducing layer 410 is preferably from about 10 nm to about 300 nm in thickness. Other materials, such as SiC, SiGeN, and SiCN, may be used.

The stress-inducing layer 410 preferably comprises a first semiconductor material and a second semiconductor material, wherein the presence of the second semiconductor material has a different lattice structure than the first semiconductor material, thereby imparting strain in the channel region. In an embodiment in which a silicon substrate is used, the first semiconductor material may be silicon and the second semiconductor material may be germanium, and therefore, the stress-inducing layer 410 may be a SiGe layer.

Figure 5:
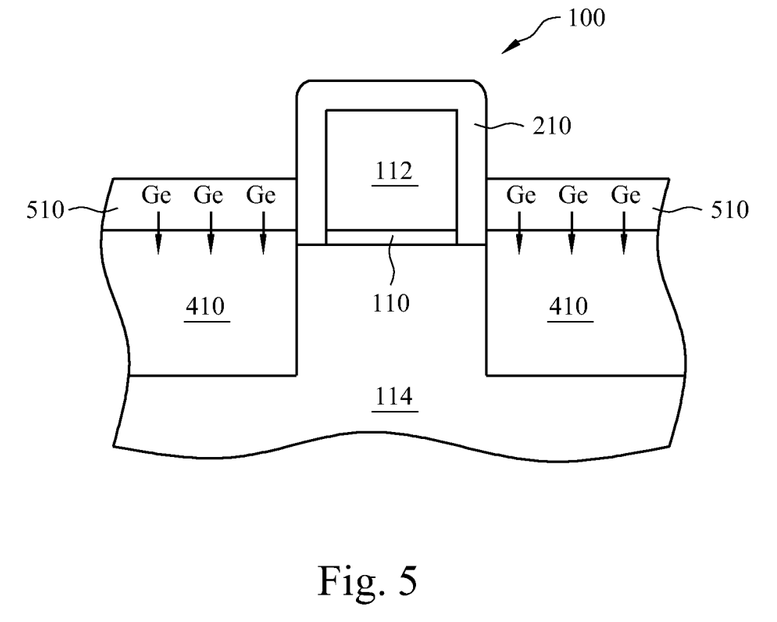

FIG. 5 illustrates the wafer 100 after performing a treatment to increase the concentration of the second semiconductor material, e.g., Ge, in the lower section of the stress-inducing layer 410, creating a depletion layer 510. In an embodiment in which the stress-inducing layer 410 comprises SiGe, the treatment may comprise exposing the stress-inducing layer 410 to a gas or liquid ambient under process conditions that cause the gas or liquid ambient to react with the silicon of the SiGe material. As a result of the reaction, the depletion layer 510 will comprise SiX, where X denotes another material, and the Ge from the depletion layer 510 is pushed further down into the stress-inducing layer 410 below the depletion layer 510, as indicated by the directional arrows in FIG. 5. In a preferred embodiment, the resulting stress-inducing layer 410 below the depletion layer 510 exhibits a gradient concentration of Ge such that the concentration variation from the top to the bottom of the stress-inducing layer 410 is greater than at least about 5%.

In an embodiment, the treatment may comprise a thermal (furnace/RTP), plasma, UV, implant, or the like treatment in an ambient of an oxidation-based gas, such as $O_2$, $H_2O$, $H_2$, $N_2O$, NO, $O_3$, or the like at a temperature from about 100° C. to about 1200° C. In this embodiment, the depletion layer may comprise a film of $Si_xO_y$.

In another embodiment, the treatment may comprise a thermal (furnace/RTP), plasma, UV, implant, or the like treatment in an ambient of a nitridation-based gas, such as $NH_3$, $N_2$, NO, $N_2O$, or the like at a temperature from about 100° C. to about 1200° C. In this embodiment, the depletion layer may comprise a film of $Si_xN_y$ or $Si_xO_yN_z$. Other ambients and/or treatments that cause a reaction with the Si and little or no reaction with the Ge may also be used.

Figure 6:
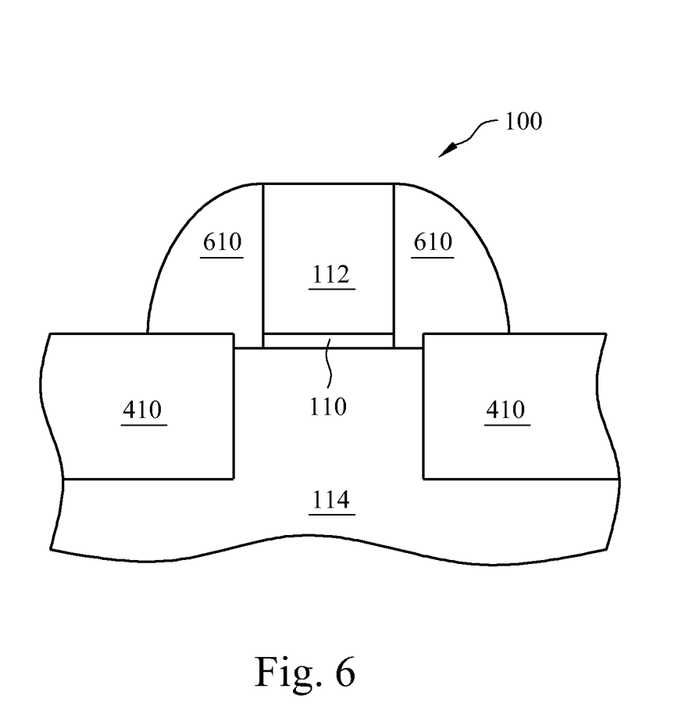

FIG. 6 illustrates the wafer 100 after the mask 210 has been removed and spacers 610 have been formed in accordance with an embodiment of the present invention. The mask 210 may be removed by a wet dip in hydrofluoric acid or a dry etch process. In an embodiment, the depletion layer 510 may be removed as illustrated in FIG. 6.

Spacers 610, which form spacers for performing one or more ion implants to create the source/drain regions, preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y$:$H_z$, or combination thereof. In a preferred embodiment, the spacers 610 are formed from a layer comprising $Si_3N_4$ that has been formed using chemical vapor deposition (CVD) techniques using silane and ammonia as precursor gases.

The spacers 610 may be patterned by performing an isotropic or anisotropic etch process, such as an isotropic etch process using a solution of phosphoric acid ($H_3PO_4$). Because the thickness of the layer of $Si_3N_4$ is greater in the regions adjacent to the gate electrode 112, the isotropic etch removes the $Si_3N_4$ material on top of the gate electrode 112 and the areas of substrate 114 not immediately adjacent to the gate electrode 112, leaving the spacers 610 as illustrated in FIG. 6. In an embodiment, the spacers 610 are from about 1 nm to about 100 nm in width.

It should be noted that a portion of the stress-inducing layer 410 may be located underneath a portion of the spacers 610, dependent upon the desired source/drain implant and electrical characteristics of the resulting source/drain regions.

Figure 7:
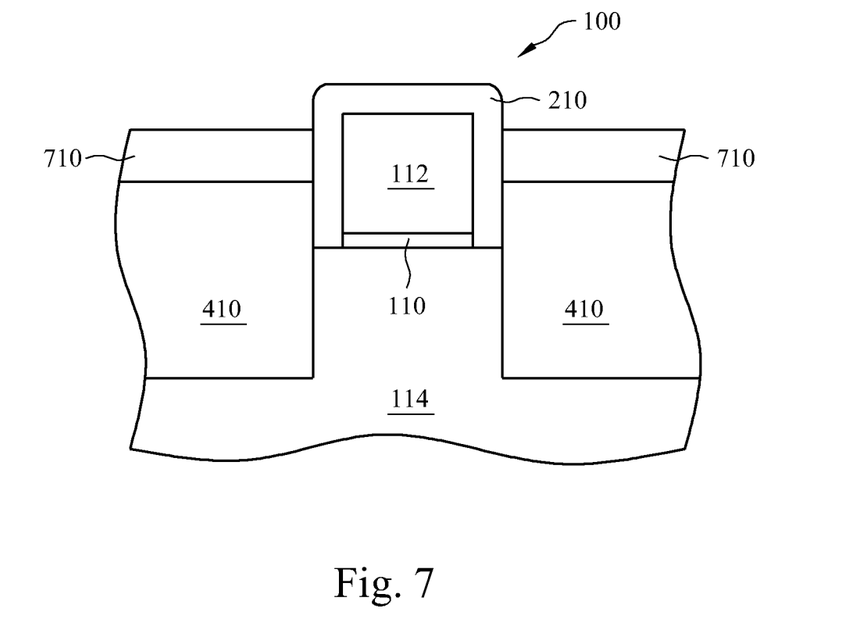
FIGS. 7-8 illustrate various process steps of fabricating a MOSFET device having localized stressors positioned over the source/drain regions in accordance with a second method embodiment of the present invention.
Figure 8:
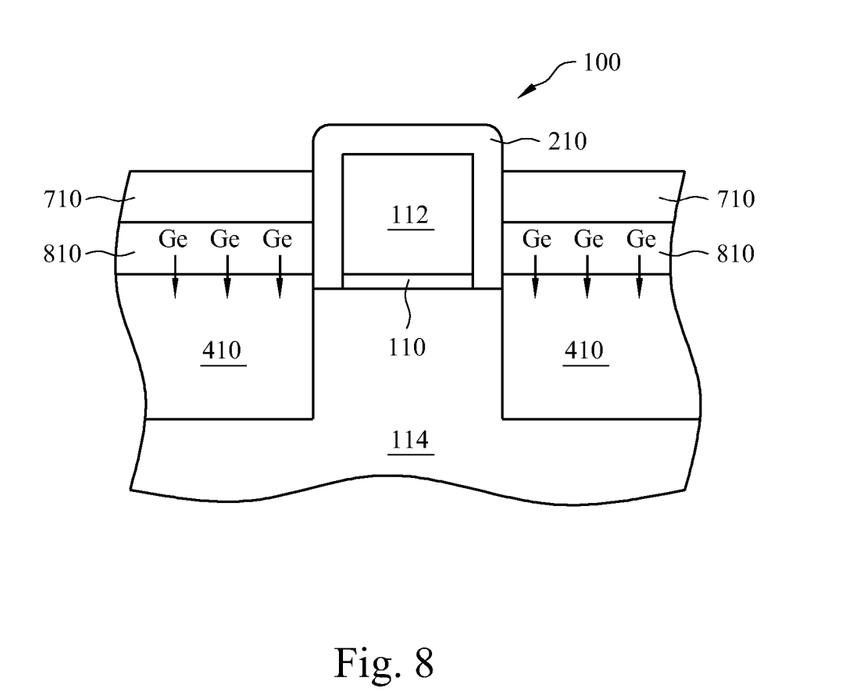

FIGS. 7-8 illustrate a second embodiment of the present invention that utilizes a treatment of an epitaxially-grown SiGe layer in accordance with an embodiment of the present invention. The second embodiment illustrated in FIGS. 7-8 assumes a wafer has been prepared in accordance with FIGS. 1-4, wherein like reference numerals refer to like elements. Accordingly, FIG. 7 illustrates wafer 100 of FIG. 4 after a reaction layer 710 has been formed over the stress-inducing layer 410.

The reaction layer 710 comprises a material that, under specific process conditions, reacts with the silicon in the SiGe, but reacts little or not at all with the Ge. In this manner, the reaction layer 710 can be made to react with the silicon and force the germanium lower into the SiGe layer, thereby increasing the Ge concentration. In an embodiment, the reaction layer 710 may comprise Co, Ni, Ti, or the like and may be formed by a CVD process, a PVD process, an ALD process, or the like. Other materials may be used.

FIG. 8 illustrates the wafer 100 of FIG. 7 after performing a treatment to cause the reaction layer 710 to react with the stress-inducing layer 410, thereby creating a reacted layer 810, in accordance with an embodiment of the present invention. The treatment may be any treatment that causes reaction layer 710 to react with the Si in the stress-inducing layer 410. As a result of the reaction, the reacted layer 810 is formed and the Ge is pushed lower into the stress-inducing layer 410, as indicated by the directional arrows in FIG. 8. It should be noted that the reacted layer 810 is formed in part from a portion of the stress-inducing layer 410. Thus, the volume of the stress-inducing layer 410 decreases while the number of Ge atoms remains relatively constant, thereby increasing the concentration of the Ge within the stress-inducing layer 410.

In an embodiment, the treatment may comprise thermal annealing in an ambient comprising, for example, an oxygen-containing gas, a nitrogen-containing gas, a combination thereof, or the like at a temperature between 100° C. and 1200° C. Other treatments, such as a rapid-thermal annealing, a laser treatment, UV curing, E-beam curing, implant treatment, a plasma treatment, an ultra-violet radiation treatment, or the like, may also be used.

Thereafter, the mask 210 may be removed, spacers may be formed, and other subsequent processing may be performed as described above with reference to FIG. 6. In an embodiment, the reacted layer 810 may be removed as illustrated in FIG. 6.

In an embodiment, the resulting stress-inducing layer 410 is a gradient layer having a lattice constant variation between the top and the bottom of the stress-inducing layer 410 of at least 0.2%, wherein the top region exhibits a larger lattice constant than the bottom region. Furthermore, the lattice constant of the substrate in the channel region is less than lower portions of the substrate due to the stress induced by the stress-inducing layer 410.

Figure 9:
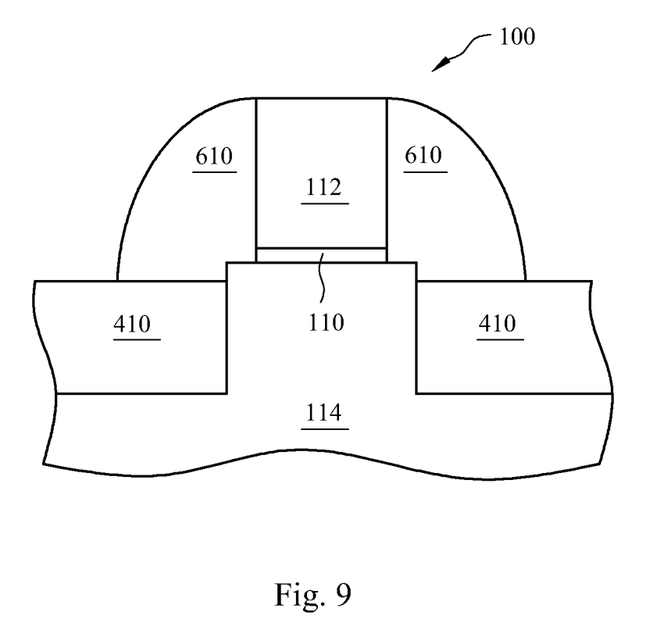
FIG. 9 illustrates an embodiment of the present invention of a MOSFET device having recessed localized stressors in the source/drain regions.

FIG. 9 illustrates an embodiment of the present invention in which the top surface of the stress-inducing layer 410 is below a major surface of the substrate 114.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a gate electrode on a substrate, the substrate comprising a first material;
   forming a stress-inducing layer on opposing sides of the gate electrode, the stress-inducing layer comprising the first material and a second material;
   converting an upper portion of the stress-inducing layer to a converted layer by reducing a number of atoms of the second material in the upper portion of the stress-inducing layer such that an upper region of a remaining stress-inducing layer has a higher concentration of the second material than a bottom portion of the remaining stress-inducing layer; and
   removing, after the converting, at least a portion of the converted layer.

2. The method of claim 1, wherein the converting is performed in an ambient comprising an oxidation-based gas or a nitridation-based gas.

3. The method of claim 1, further comprising forming recesses in the substrate on opposing sides of the gate electrode prior to the forming the stress-inducing layer, the stress-inducing layer being formed in the recesses.

4. The method of claim 1, further comprising forming a mask layer over the gate electrode prior to the forming the stress-inducing layer.

5. The method of claim 1, wherein the converting comprises:
   forming a reaction layer over the stress-inducing layer; and
   causing the reaction layer to react with the first material in the stress-inducing layer, thereby causing atoms of the second material in the upper portion of the stress-inducing layer to be pushed into the bottom portion of the stress-inducing layer.

6. The method of claim 5, wherein the causing comprises a thermal anneal, a rapid-thermal anneal, an ultra-violet treatment, or an E-beam curing treatment.

7. The method of claim 5, wherein the reaction layer comprises Co, Ni, or Ti.

8. The method of claim 1, wherein the converting is performed at least in part by
   performing a treatment in an ambient, the treatment causing the first material in the stress-inducing layer to react with the ambient creating the converted layer, the converted layer being a depletion layer in a top portion of the stress-inducing layer, the depletion layer being substantially free of the second material.

9. The method of claim 1, wherein the performing the treatment is performed at a temperature from about 100° C. to about 1200° C.

10. The method of claim 8, wherein the treatment comprises a thermal treatment, a plasma treatment, an ultra-violet treatment, an implant, or a combination thereof.

11. The method of claim 8, wherein the first material is silicon and the second material is germanium.

12. The method of claim 8, further comprising forming recesses in the substrate on opposing sides of the gate electrode prior to the forming the stress-inducing layer.

13. The method of claim 8, further comprising forming a mask layer over the gate electrode prior to the forming the stress-inducing layer.

14. The method of claim 1, wherein the converting is performed at least in part by:
   forming a reaction layer over the stress-inducing layer; and
   performing a treatment, the treatment causing the reaction layer to react with the first material in the stress-inducing layer, thereby creating the converted layer positioned between the reaction layer and the remaining stress-inducing layer, the converted layer being at least partially composed of material from the stress-inducing layer, the converted layer being substantially free of the second material.

15. The method of claim 14, further comprising forming recesses in the substrate on opposing sides of the gate electrode prior to the forming the stress-inducing layer, the stress-inducing layer being formed in the recesses.

16. The method of claim 14, further comprising forming a mask layer over the gate electrode prior to the forming the stress-inducing layer.

17. The method of claim 14, wherein the treatment comprises a thermal anneal, a rapid-thermal anneal, an ultra-violet treatment, or an E-beam curing treatment.

18. The method of claim 14, wherein the treatment is performed in an ambient comprising oxygen, nitrogen, or a combination thereof.

19. The method of claim 14, wherein the treatment is performed at a temperature from about 100° C. to about 1200° C.

20. The method of claim 14, wherein the first material is silicon and the second material is germanium.

UNITED STATES PATENT AND TRADEMARK OFFICE
CERTIFICATE OF CORRECTION

| | | |
|---|---|---|
| PATENT NO. | : 8,557,669 B2 | Page 1 of 1 |
| APPLICATION NO. | : 12/176655 | |
| DATED | : October 15, 2013 | |
| INVENTOR(S) | : Chien-Hao Chen et al. | |

It is certified that error appears in the above-identified patent and that said Letters Patent is hereby corrected as shown below:

On Title Page, insert --(62) Related U.S. Application Data, Division of application No. 11/034,285, filed on Jan. 12, 2005, now abandoned--.

In the Claims:

In Col. 8, line 11, claim 9, delete "claim 1" and insert --claim 8--.

Signed and Sealed this
First Day of April, 2014

Michelle K. Lee
*Deputy Director of the United States Patent and Trademark Office*